US008502961B2

(12) United States Patent
Kawanami

(10) Patent No.: US 8,502,961 B2
(45) Date of Patent: Aug. 6, 2013

(54) EXPOSURE METHOD, EXPOSURE APPARATUS, AND METHOD OF MANUFACTURING DEVICE

(75) Inventor: Kentarou Kawanami, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 353 days.

(21) Appl. No.: 12/828,803

(22) Filed: Jul. 1, 2010

(65) Prior Publication Data

US 2011/0001956 A1     Jan. 6, 2011

(30) Foreign Application Priority Data

Jul. 2, 2009   (JP) .................................. 2009-158196

(51) Int. Cl.
| G03B 27/32 | (2006.01) |
| G03B 27/68 | (2006.01) |
| G03B 27/52 | (2006.01) |
| G03B 27/42 | (2006.01) |
| G03B 27/54 | (2006.01) |

(52) U.S. Cl.
USPC .................. 355/77; 355/30; 355/52; 355/53; 355/55; 355/67

(58) Field of Classification Search
USPC ..... 355/30, 52, 53, 55, 67–71, 77; 250/492.1, 250/492.2, 492.22, 548; 430/8, 22, 30, 311, 430/312
See application file for complete search history.

(56) References Cited

U.S. PATENT DOCUMENTS

| 4,666,273 | A | * | 5/1987 | Shimizu et al. ............... 353/101 |
| 4,801,977 | A | * | 1/1989 | Ishizaka et al. ................. 355/30 |
| 5,270,771 | A | * | 12/1993 | Sato ................................ 355/53 |
| 5,424,803 | A | * | 6/1995 | Noguchi ......................... 355/53 |
| 5,581,324 | A | * | 12/1996 | Miyai et al. ..................... 355/53 |
| 5,801,815 | A | * | 9/1998 | Takahashi ....................... 355/53 |
| 2001/0046041 | A1 | * | 11/2001 | Hirano .......................... 355/133 |
| 2006/0244940 | A1 | * | 11/2006 | Uehara ........................... 355/69 |

FOREIGN PATENT DOCUMENTS

| JP | 7-183210 A | 7/1995 |
| JP | 10-125597 A | 5/1998 |
| JP | 11-317354 A | 11/1999 |
| WO | 02/25711 A1 | 3/2002 |

* cited by examiner

Primary Examiner — Toan Ton
Assistant Examiner — Christina Riddle
(74) Attorney, Agent, or Firm — Rossi, Kimms & McDowell LLP

(57) ABSTRACT

An exposure method comprises a calculation step of calculating a correction amount of a correction unit which corrects a change in imaging characteristics of a projection optical system based on at least one of parameters including a numerical aperture and effective light source of an illumination optical system, a numerical aperture of the projection optical system, and a size and pitch of a pattern, and an amount of change in environment condition in the projection optical system; and a correction step of making the correction unit operate in accordance with the correction amount calculated in the calculation step.

7 Claims, 3 Drawing Sheets

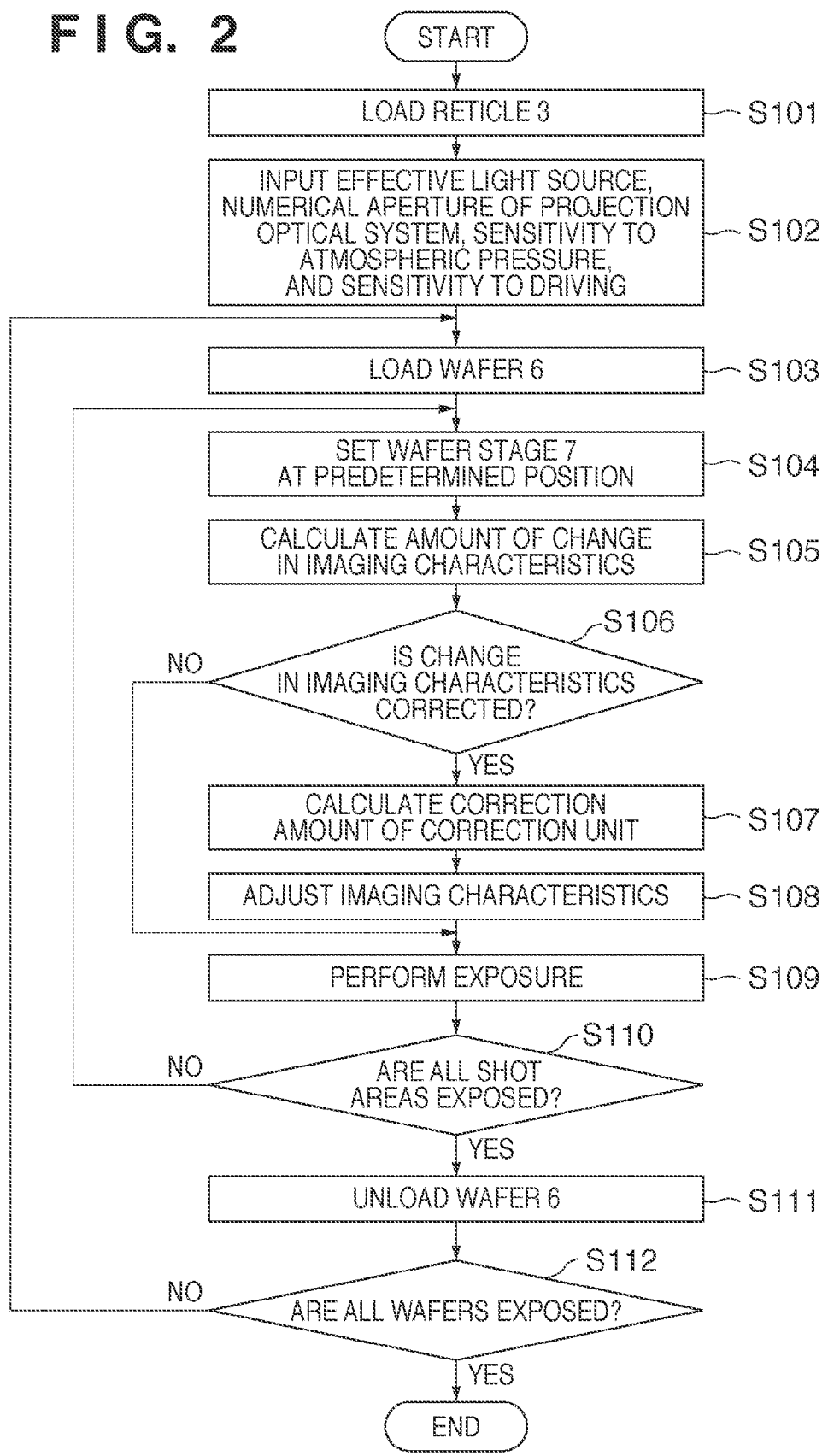

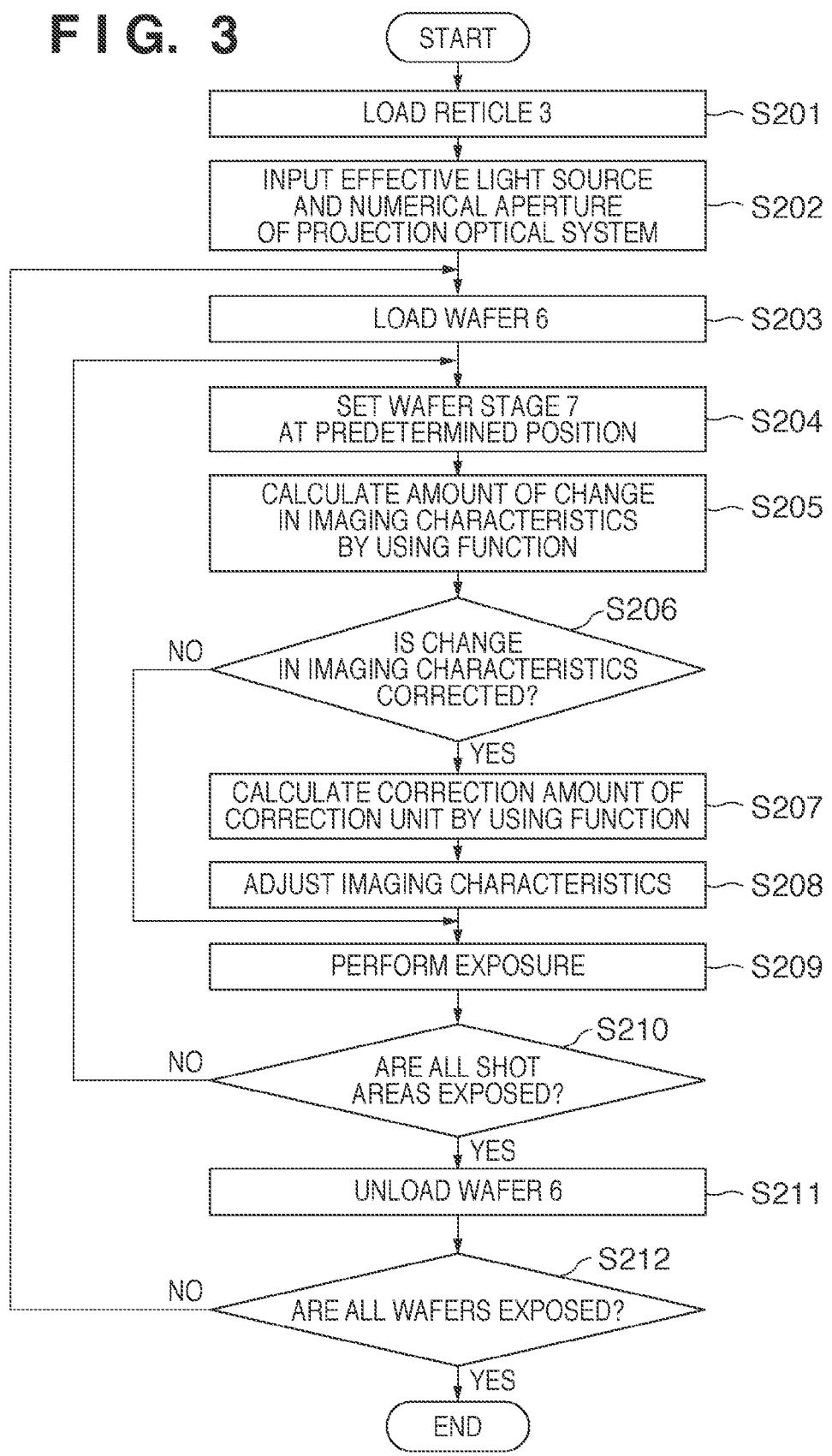

EXPOSURE METHOD, EXPOSURE APPARATUS, AND METHOD OF MANUFACTURING DEVICE

BACKGROUND OF THE INVENTION

1. Field of the Invention

The present invention relates to an exposure method, an exposure apparatus, and a method of manufacturing a device by using the exposure apparatus.

2. Description of the Related Art

In a projection exposure apparatus, when environment conditions such as atmospheric pressure, temperature, and humidity vary, the imaging characteristics of a projection optical system change. With recent miniaturization of semiconductor devices, demands have arisen for increases in the accuracy of imaging characteristics influenced by variations in environment conditions. This makes it necessary to correct the imaging characteristics. For example, Japanese Patent Laid-Open No. 7-183210 discloses a method of correcting changes in imaging characteristics due to variations in environment conditions. Japanese Patent Laid-Open No. 7-183210 discloses a method of detecting a change in atmospheric pressure as one of environment conditions and correcting changes in projection magnification and focus position with the change in atmospheric pressure by driving an optical member in a projection optical system in the optical axis direction. Letting $\Delta P$ be an atmospheric pressure change and K be an atmospheric pressure correction coefficient for a projection magnification, a projection magnification change $\Delta M_P$ due to an atmospheric pressure change can be expressed by $$\Delta M_P = K_M \times \Delta P \qquad (1)$$

where $K_M$ is the coefficient determined by the characteristics of the projection optical system. This technique corrects imaging characteristics by calculating the driving amount of the projection optical system in the optical axis direction from $\Delta M_P$ calculated by using equation (1).

The amount of change in aberration per unit atmospheric pressure is constant. However, the diffracted light intensity distribution within the pupil plane varies depending on the effective light source of an illumination optical system (the light intensity distribution in the pupil plane), the numerical aperture of a projection optical system, a mask, and conditions for the pattern of the mask. For this reason, changes in imaging characteristics due to changes in atmospheric pressure differ for the respective conditions described above. The same applies to changes in imaging characteristics accompanying the above changes in atmospheric pressure. If, therefore, the correction coefficient $K_M$ described above is uniquely determined regardless of the effective light source of the illumination optical system, the numerical aperture of the projection optical system, and the pattern of a mask, it is impossible to accurately correct changes in imaging characteristics due to changes in atmospheric pressure.

SUMMARY OF THE INVENTION

The present invention accurately corrects changes in the imaging characteristics of a projection optical system due to changes in environment conditions within the projection optical system.

According to the present invention, there is provided an exposure method of illuminating a mask, on which a pattern is formed, by using an illumination optical system, and projecting the illuminated pattern onto a substrate through a projection optical system, the method comprising a calculation step of calculating a correction amount of a correction unit which corrects a change in imaging characteristics of the projection optical system based on at least one of parameters including a numerical aperture and effective light source of the illumination optical system, a numerical aperture of the projection optical system, and a size and pitch of the pattern, and an amount of change in environment condition in the projection optical system; and a correction step of making the correction unit operate in accordance with the correction amount calculated in the calculation step.

Further features of the present invention will become apparent from the following description of exemplary embodiments with reference to the attached drawings.

BRIEF DESCRIPTION OF THE DRAWINGS

FIG. 2 is a flowchart for an exposure method according to the first embodiment; and FIG. 3 is a flowchart for an exposure method according to the second embodiment.

DESCRIPTION OF THE EMBODIMENTS

Figure 1:
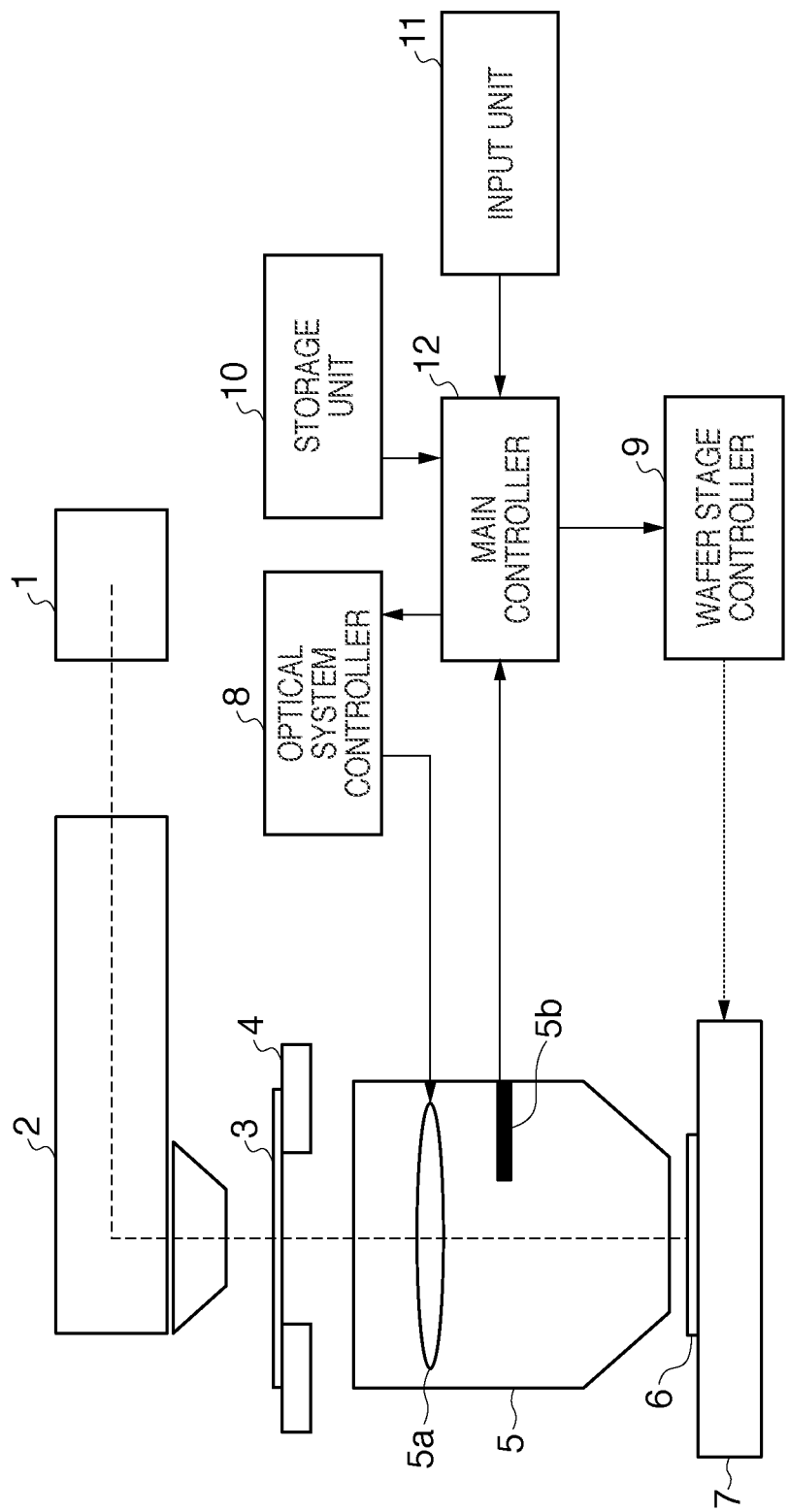
FIG. 1 is a view showing the arrangement of a projection exposure apparatus according to the first and second embodiments.

The embodiments of an exposure method and exposure apparatus according to the present invention will be described in detail below with reference to the accompanying drawings.

[First Embodiment]

FIG. 1 is a view showing the arrangement of an exposure apparatus according to an embodiment of the present invention. The first embodiment shows an example of correcting changes in the imaging characteristics of a projection optical system due to changes in atmospheric pressure as one of environment conditions within the projection optical system (a housing accommodating an optical system). Environment conditions which change within the projection optical system can be at least an atmospheric pressure, temperature, or humidity. The imaging characteristics of the projection optical system which are correction targets in the first embodiment include a projection magnification and a best focus position. However, imaging characteristics such as distortion aberration and curvature of field can be correction targets. Exposure light emitted from a light source 1 passes through an illumination optical system 2, and illuminates a mask (reticle) 3 on which a pattern is formed. A reticle stage 4 holds the reticle 3. The pattern of the reticle 3 is transferred onto a wafer (substrate) 6 through a projection optical system 5. An optical element 5a of the optical elements included in the projection optical system 5 is configured to move in a direction (Z direction) parallel to the optical axis of the projection optical system 5. An optical system controller 8 controls the movement of the optical element 5a. Reference numeral 5b denotes a measurement device (barometer) which is placed in the projection optical system 5 and measures the amount of change in pressure. A wafer stage (substrate stage) 7 is configured to hold the wafer 6 and move in the X, Y, and Z directions. A wafer stage controller 9 controls the movement of the wafer stage 7.

A storage unit 10 stores a table of sensitivities to atmospheric pressure and a table of sensitivities to driving (both of which will be described later). An input unit 11 receives, as an exposure recipe, at least one parameter of the numerical aperture and effective light source of the illumination optical system 2, the numerical aperture of the projection optical system 5, and the size and pitch of a pattern. The storage unit 10 then stores the exposure recipe. A main controller 12 reads out parameters such as a numerical aperture and the table of sensitivities to atmospheric pressure from the storage unit 10, and calculates the amounts of change in imaging characteristics based on the readout information and the amount of change in atmospheric pressure measured by a barometer 5b. The main controller 12 reads out the table of sensitivities to driving from the storage unit 10, and calculates the driving amounts (the correction amounts of the correction units) of the wafer stage 7 and optical element 5a based on the readout information, the parameters, and the calculated amounts of change in imaging characteristics. The main controller 12 issues commands to the optical system controller 8 and the wafer stage controller 9 to make the wafer stage 7 and the optical element 5a operate in accordance with the calculated driving amounts. In the first embodiment, the optical system controller 8 and the wafer stage controller 9 form correction units which correct a change in the imaging characteristics of the projection optical system due to a change in environment condition in the projection optical system by moving the wafer stage 7 and the optical element 5a in the Z direction. The main controller 12 serves as a controller which calculates the correction amounts of the correction units (the optical system controller 8 and the wafer stage controller 9) which correct a change in the imaging characteristics of the projection optical system 5.

FIG. 2 is a flowchart showing a method of exposing a pattern on the wafer 6 upon correcting a change in the imaging characteristics of the projection optical system 5 due to a change in atmospheric pressure by using the exposure apparatus in FIG. 1. In step S101, the designated reticle 3 is loaded onto the reticle stage 4. In step S102, the input unit 11 receives the effective light source of the illumination optical system 2, the numerical aperture of the projection optical system 5, and correspondence tables of sensitivities to atmospheric pressure and sensitivities to driving, which are suitable for the transfer of the pattern formed on the loaded reticle 3 onto the wafer 6. In this case, the storage unit 10 stores the correspondence tables of sensitivities to atmospheric pressure and sensitivities to driving. Step S102 forms the obtaining step of obtaining an effective light source, the numerical aperture of the projection optical system 5, and tables of sensitivities to atmospheric pressure and sensitivities of driving. In step S103, the wafer 6 is loaded on the wafer stage 7. In step S104, the wafer stage controller 9 drives the wafer stage 7 in the plane direction of the wafer so as to transfer the pattern at a desired position on the wafer.

In step S105, the main controller 12 calculates the amounts of change in imaging characteristics due to a change in atmospheric pressure. Step S105 forms the first calculation step of calculating the amounts of change in imaging characteristics. The first embodiment has exemplified the best focus position and the projection magnification as imaging characteristics as correction targets. However, it is possible to set other imaging characteristics (distortion aberration and curvature of field) as correction targets. An atmospheric pressure change $\Delta P$ which is the difference between an atmospheric pressure measurement value $P_M$ of the barometer 5b and a reference atmospheric pressure (e.g., 1013 hPa) $P_R$ can be given by $$\Delta P = P_M - P_R \quad (2)$$

In addition, the relationships between changes in atmospheric pressure and the amounts of change in imaging characteristics can be given by $$\Delta F_P = K_F \times \Delta P \quad (3)$$

$$\Delta M_P = K_M \times \Delta P \quad (4)$$

where $\Delta F_P$ and $\Delta M_P$ are the best focus position of the projection optical system 5 and the amount of change in projection magnification, respectively, and $K_F$ and $K_M$ are a best focus position per unit atmospheric pressure and the amount of change in projection magnification (to be expressed as sensitivities to atmospheric pressure hereinafter), respectively. The sensitivities $K_F$ and $K_M$ to atmospheric pressure are the first correction coefficients which define the relationship between the amount of change in environment condition (pressure) and the amounts of change in imaging characteristics (the best focus position and the projection magnification) due to the change in environment condition. The sensitivities $K_F$ and $K_M$ to atmospheric pressure are also coefficients determined by at least one of the above parameters including the effective light source of the illumination optical system, the numerical aperture of the projection optical system 5, and the pattern of the reticle 3. For this reason, a correspondence table of the sensitivities $K_F$ and $K_M$ to atmospheric pressure and at least one parameter is obtained in advance by optical calculation or experiment. This table is input in step S102 and stored in the storage unit 10. The main controller 12 then obtains the necessary sensitivities $K_F$ and $K_M$ to atmospheric pressure by referring to the correspondence table of the sensitivities $K_F$ and $K_M$ to atmospheric pressure.

In step S106, the main controller 12 determines whether to correct changes in imaging characteristics due to a change in atmospheric pressure. Step S106 is the determination step of determining whether to execute the second calculation step and the correction step (to be described later), depending on whether the calculated amounts of change in imaging characteristics fall within allowable ranges. If the amounts of change in the best focus position of the projection optical system and projection magnification due to the change in atmospheric pressure fall within the allowable ranges, the process advances to step S109 to perform exposure. If the change amounts $\Delta F_P$ and $\Delta M_P$ fall outside the allowable ranges, the main controller 12 advances to step S107 to calculate the correction amounts of the correction units which correct the changes in imaging characteristics. In step S107, the main controller 12 calculates the driving amounts (correction amounts) of the wafer stage 7 and optical element 5a in the projection optical system 5. Step S107 forms the second calculation step of calculating the correction amounts of the correction units. Steps S105 and S107 form the calculation step of calculating the correction amounts of the correction units based on at least one parameter and the amounts of change in environment conditions in the projection optical system. This embodiment has exemplified the case in which imaging characteristics are corrected by driving the wafer stage 7 and the optical element 5a. However, the present invention is not limited to any specific correction technique as long as imaging characteristics as correction targets can be corrected. Letting $\Delta T_X$ be the driving amount of the wafer stage 7 in the optical axis direction and $\Delta T_Y$ be the driving amount of the optical element 5a in the optical axis direction, the relationship between the amounts of changes $\Delta F_P$ and $\Delta M_P$ of imaging characteristics can be represented by equation (5) given below. This makes it possible to calculate the driving amounts $\Delta T_X$ and $\Delta T_Y$.

$$\begin{bmatrix} \Delta F_P \\ \Delta M_P \end{bmatrix} = \begin{bmatrix} X_F & Y_F \\ X_M & Y_M \end{bmatrix} \begin{bmatrix} \Delta T_X \\ \Delta T_Y \end{bmatrix} \quad (5)$$

where $X_F$ and $X_M$ are respectively the amounts of change in best focus position and projection magnification per unit driving amount of the wafer stage 7 (to be expressed as sensitivities to driving of the wafer stage hereinafter) in the optical axis direction, and $Y_F$ and $Y_M$ are respectively the amounts of change in best focus position and projection magnification per unit driving amount of the optical element 5a (to be expressed as sensitivities to driving of the optical element hereinafter) in the optical axis direction. The sensitivities $X_F$ and $X_M$ to driving of the wafer state and the sensitivities $Y_F$ and $Y_M$ to driving of the optical element are the second correction coefficients which define the relationship between the amounts of change in the imaging characteristics of the projection optical system 5 and the correction amounts of the correction units. The sensitivities $X_F$, $X_M$, $Y_F$, and $Y_M$ to driving are coefficients determined by at least one of the above parameters including the effective light source of the illumination optical system, the numerical aperture of the projection optical system 5, and the pattern of the reticle 3. For this reason, a correspondence table of the sensitivities $X_F$, $X_M$, $Y_F$, and $Y_M$ to driving and at least one parameter is obtained in advance by optical calculation or experiment. This table is input in step S102 and stored in the storage unit 10.

In step S108, the wafer stage controller 9 and the optical system controller 8 adjust imaging characteristics by driving the wafer stage 7 and the optical element 5a in the optical axis direction. Step S108 forms the correction step of making the correction units operate in accordance with calculated correction amounts. The main controller 12 issues a command to the wafer stage controller 9 to drive the wafer stage 7 to a position $TP_X$ in the optical axis direction. The wafer state position $TP_X$ can be expressed by equation (6) given below. The main controller 12 also issues a command to the optical system controller 8 to drive the optical element 5a to a position $TP_Y$ in the optical axis direction. The optical element position $TP_Y$ can be given by equation (7) given below.

$$TP_X = TP_{XR} + \Delta T_X \quad (6)$$

$$TP_Y = TP_{YR} + \Delta T_Y \quad (7)$$

where $TP_{XR}$ is the position of the wafer stage 7 in the optical axis direction at the reference atmospheric pressure $P_R$, and $TP_{YR}$ is the position of the optical element 5a in the optical axis direction at the reference atmospheric pressure $P_R$. It is possible to correct changes in best focus position and projection magnification due to a change in atmospheric pressure, as described above.

In step S109, exposure light from the light source 1 illuminates the reticle 3. The pattern on the reticle 3 is transferred onto an exposure target area on the wafer 6 through the projection optical system 5. In step S110, the main controller 12 determines whether pattern transfer to all the exposure target shots within the wafer is complete. If the pattern transfer is complete, the process advances to step S111. If the pattern transfer is not complete, the process returns to step S104 to repeat steps S104 to S109 until the pattern transfer is complete. In step S111, the wafer 6 having undergone exposure is unloaded. In step S112, the main controller 12 determines whether pattern transfer to all the wafers of the lot is complete. If the pattern transfer is complete, exposure is complete. If the pattern transfer is not complete, the main controller 12 repeats steps S103 to S111.

As described above, according to this embodiment, it is possible to correct a change in imaging characteristics due to a change in environment condition in the projection optical system for each of the followings: the effective light source of the illumination optical system, the numerical aperture of the projection optical system, and a reticle condition. Note that the above embodiment has presented the two imaging characteristics as correction targets, namely the best focus position and the projection magnification. However, the types and number of imaging characteristics as correction targets are not specifically limited. However, the number of correction units needs to be equal to or more than the number of imaging characteristics as correction targets.

[Second Embodiment]

Another embodiment of the present invention will be described with reference to FIGS. 1 and 3. The first embodiment obtains the necessary values of sensitivity to atmospheric pressure and sensitivity to driving by referring to the correspondence table of sensitivities to atmospheric pressure, sensitivities to driving, and at least one parameter. In the second embodiment, however, sensitivity to atmospheric pressure and sensitivity to driving are expressed as function expressions for parameters instead of a correspondence table of parameters. Substituting parameters into the function expressions yields the necessary values of sensitivity to atmospheric pressure and sensitivity to driving.

Since steps S201, S203, and S204 are the same as steps S101, S103, and S104 in the first embodiment. In step S202, parameters such as the effective light source of an illumination optical system 2 and the numerical aperture of a projection optical system 5 which are suitable for the transfer of the pattern formed on a loaded reticle 3 onto a wafer 6 are input. In step S102 corresponding to the first embodiment, sensitivities to atmospheric pressure and sensitivities to driving are input in addition to the effective light source of the illumination optical system 2 and the numerical aperture of the projection optical system 5. In step S202, function expressions for sensitivities to atmospheric pressure and sensitivities to driving are input.

In step S205, a main controller 12 calculates the amounts of change in imaging characteristics due to a change in atmospheric pressure. In the first embodiment, with regard to the sensitivities $K_F$ and $K_M$ to atmospheric pressure, the main controller 12 calculates the amounts of changes $\Delta F_P$ and $\Delta M_P$ in imaging characteristics by using numerical values in the correspondence table obtained in advance. In the second embodiment, in step S105, the main controller 12 calculates parameters $K_F$ and $K_M$ dependent on the effective light source of the illumination optical system, the numerical aperture of the projection optical system 5, and the size and pitch of the pattern of the reticle 3. The sensitivities $K_F$ and $K_M$ to atmospheric pressure are expressed by function equations (11) and (12) using the numerical apertures of the projection optical system 5 and illumination optical system 2 as parameters.

$$K_F = A_F \times NA_{ul}{}^2 + B_F \times NA_{il}{}^2 + C_F \times NA_{ul} \times NA_{il} + D_F \times NA_{ul} + E_F \times NA_{il} + F_F \quad (11)$$

$$K_M = A_M \times NA_{ul}{}^2 + B_M \times NA_{il}{}^2 + C_M \times NA_{ul} \times NA_{il} + D_M \times NA_{ul} + E_M \times NA_{il} + F_M \quad (12)$$

where $NA_{ul}$ is the numerical aperture of the projection optical system 5, and $NA_{il}$ is the numerical aperture of the illumination optical system 2. Function equations (11) and (12) express the sensitivities $K_F$ and $K_M$ to atmospheric pressure by using the numerical aperture of the projection optical system 5 and the numerical aperture of the illumination optical system 2 as parameters. Parameters expressing the sensitivities $K_F$ and $K_M$ to atmospheric pressure are not limited as long as they are a parameter for a reticle loaded in step S201 and a parameter input in step S202. In addition, equations (11) and (12) are expressed by quadratic functions. However, the degrees and functions that express function expressions are not specifically limited. It is possible to obtain coefficients $A_F$ to $F_F$ and $A_M$ to $F_M$ of function equations (11) and (12) in advance by optical calculation or experiment and store them in a storage unit 10 in advance. It is possible to calculate the amounts of change $\Delta F_P$ and $\Delta M_P$ by using the coefficients $A_F$ to $F_F$ and $A_M$ to $F_M$ stored in the storage unit 10, the reticle 3 loaded in step S201, the effective light source of the illumination optical system input in step S202, and the numerical aperture of the projection optical system 5. Step S206 is the same as step S106 in the first embodiment.

In step S207, the main controller 12 calculates the driving amounts of a wafer stage 7 and an optical element 5a in the projection optical system 5. This embodiment corrects imaging characteristics by driving the wafer stage 7 and the optical element 5a. However, the correction technique to be used is not specifically limited as long as imaging characteristics as correction targets can be corrected. Letting $\Delta T_X$ be the driving amount of the wafer stage 7 in the optical axis direction and $\Delta T_Y$ be the driving amount of the optical element 5a in the optical axis direction, the relationship between the amounts of change $\Delta F_P$ and $\Delta M_P$ of imaging characteristics can be represented by equation (13) given below. This makes it possible to calculate the driving amounts $\Delta T_X$ and $\Delta T_Y$.

$$\begin{bmatrix} \Delta F_P \\ \Delta M_P \end{bmatrix} = \begin{bmatrix} X_F & Y_F \\ X_M & Y_M \end{bmatrix} \begin{bmatrix} \Delta T_X \\ \Delta T_Y \end{bmatrix} \quad (13)$$

where $X_F$ and $X_M$ are respectively the amounts of change in best focus position and projection magnification per unit driving amount of the wafer stage 7 (to be expressed as sensitivities to driving of the wafer stage hereinafter) in the optical axis direction, and $Y_F$ and $Y_M$ are respectively the amounts of change in best focus position and projection magnification per unit driving amount of the optical element 5a (to be expressed as sensitivities to driving of the optical element hereinafter) in the optical axis direction. The sensitivities $X_F$ and $X_M$ to driving of the wafer state and the sensitivities $Y_F$ and $Y_M$ to driving of the optical element are parameters dependent on the effective light source of the illumination optical system 2 input in step S202, the numerical aperture of the projection optical system 5, and the size and pitch of the pattern of the reticle 3. The sensitivities $X_F$ and $X_M$ to driving of the wafer stage and the sensitivities $Y_F$ and $Y_M$ to driving of the optical element are expressed by function equations (14) to (17) given below using the numerical aperture of the projection optical system 5 and the numerical aperture of the illumination optical system 2 as parameters.

$$X_F = A_{FX} \times NA_{ul}{}^2 + B_{FX} \times NA_{il}{}^2 + C_{FX} \times NA_{ul} \times NA_{il} + D_{FX} \times NA_{ul} + E_{FX} \times NA_{il} + F_{FX} \quad (14)$$

$$X_M = A_{MX} \times NA_{ul}{}^2 + B_{MX} \times NA_{il}{}^2 + C_{MX} \times NA_{ul} \times NA_{il} + D_{MX} \times NA_{ul} + E_{MX} \times NA_{il} + F_{MX} \quad (15)$$

$$Y_F = A_{FY} \times NA_{ul}{}^2 + B_{FY} \times NA_{il}{}^2 + C_{FY} \times NA_{ul} \times NA_{il} + D_{FY} \times NA_{ul} + E_{FY} \times NA_{il} + F_{FY} \quad (16)$$

$$Y_M = A_{MY} \times NA_{ul}{}^2 + B_{MY} \times NA_{il}{}^2 + C_{MY} \times NA_{ul} \times NA_{il} + D_{MY} \times NA_{ul} + E_{MY} \times NA_{il} + F_{MY} \quad (17)$$

where $NA_{ul}$ is the numerical aperture of the projection optical system 5, and $NA_{il}$ is the numerical aperture of the illumination optical system 2. Equations (14) to (17) express the sensitivities $X_F$ and $X_M$ to driving of the wafer stage and the sensitivities $Y_F$ and $Y_M$ to driving of the optical element by using the numerical aperture of the projection optical system 5 and the numerical aperture of the illumination optical system 2 as parameters. Parameters expressing the sensitivities $X_F$ and $X_M$ to driving of the wafer stage and the sensitivities $Y_F$ and $Y_M$ to driving of the optical element are not limited as long as they are parameters for a reticle loaded in step S201 and parameters input in step S202. In addition, equations (14) to (17) are expressed by quadratic functions. However, the degrees and functions which express function expressions are not specifically limited. It is possible to obtain coefficients $A_{FX}$ to $F_{FX}$, $A_{MX}$ to $F_{MX}$, $A_{FY}$ to $A_{FY}$, and $A_{MY}$ to $F_{MY}$ of equations (14) to (17) in advance by optical calculation or experiment and store them in the storage unit 10 in advance. It is possible to calculate the driving amounts $\Delta T_X$ and $\Delta T_Y$ by using the coefficients $A_{FX}$ to $F_{FX}$, $A_{MX}$ to $F_{MX}$, $A_{FY}$ to $F_{FY}$, and $A_{MY}$ to $F_{MY}$, the reticle 3 loaded in step S201, the effective light source of the illumination optical system input in step S202, and the numerical aperture of the projection optical system 5.

Steps S208 to S212 are the same as steps S108 to S112 in the first embodiment.

A method of manufacturing a device using the above exposure apparatus will be described next. Devices are manufactured by a step of transferring by exposure a pattern onto a substrate 6 using the exposure apparatus described above, a step of developing the substrate 6 exposed in the exposing step, and other known steps of processing the substrate 6 developed in the developing step. For example, the devices can be a semiconductor integrated circuit device, liquid crystal display device, and the like. The substrate 6 can be a wafer, glass plate, or the like. The known steps are, for example, oxidation, film formation, deposition, doping, planarization, dicing, bonding, and packaging steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-158196, filed Jul. 2, 2009, which is hereby incorporated by reference herein in its entirety.

What is claimed is:

1. An exposure method of illuminating a mask, on which a pattern is formed, using an illumination optical system, and projecting an image of a pattern of the illuminated mask onto a substrate through a projection optical system, the method comprising:

an obtaining step of obtaining data of an amount of change in an environment condition in the projection optical system and data of at least one of parameters, including a numerical aperture and effective light source of the illumination optical system, a numerical aperture of the projection optical system, and a size and pitch of the pattern;

a calculation step of calculating a correction amount of a correction unit which corrects a change in imaging characteristics of the projection optical system based on a first coefficient defining a relationship between the amount of change in the environment condition and an amount of change in imaging characteristics of the projection optical system and a second coefficient defining a relationship between the amount of change in imaging characteristics of the projection optical system and the correction amount of the correction unit; and a correction step of making the correction unit operate in accordance with the correction amount calculated in the calculation step, wherein values of the first coefficient and the second coefficient are determined by a value of at least one of the parameters, wherein the calculation step includes:

a first calculation step of calculating an amount of change in imaging characteristics of the projection optical system using the amount of change in the environment condition and the first coefficient, and a second calculation step of calculating a correction amount of the correction unit using the amount of change in the imaging characteristics calculated in the first calculation step, and the second coefficient.

2. The method according to claim 1, wherein:

in the first calculation step, data of the first coefficient is obtained by referring to a correspondence table of the first coefficient and the at least one of the parameters, and in the second calculation step, data of the second coefficient is obtained by referring to a correspondence table of the second coefficient and the at least one of the parameters.

3. The method according to claim 1, wherein:

the first coefficient and the second coefficient are respectively expressed by function expressions based on the at least one of the parameters, in the first calculation step, a value of the first coefficient is calculated by substituting the value of the at least one of the parameters into a function expression expressing the first coefficient using the at least one of the parameters, and in the second calculation step, a value of the second coefficient is calculated by substituting a value of the at least one of the parameters into a function expression expressing the second coefficient using the at least one of the parameters.

4. The method according to claim 1, wherein:

the environment condition is at least one of an atmospheric pressure, a temperature, or a humidity in the projection optical system, the imaging characteristic is at least one of a projection magnification, distortion aberration, curvature of field, or a best focus position, and the correction amount of correction unit is a movement amount of at least one of a substrate stage which holds the substrate or an optical element included in the projection optical system.

5. The method according to claim 1, further comprising a determination step of determining whether to execute the second calculation step and the correction step, depending on whether the amount of change in imaging characteristics calculated in the first calculation step falls within an allowable range.

6. An exposure apparatus which illuminates a mask, on which a pattern is formed, by using an illumination optical system, and projects an image of a pattern of the illuminated mask onto a substrate through a projection optical system, the apparatus comprising:

an obtaining unit which obtains data an amount of change in an environment condition in the projection optical system and data of at least one of parameters, including a numerical aperture and effective light source of the illumination optical system, a numerical aperture of the projection optical system, and a size and pitch of the pattern;

a correction unit which corrects a change in imaging characteristics of the projection optical system; and a controller which controls said correction unit, wherein said controller is configured to:

calculate a correction amount of said correction unit which corrects the change in imaging characteristics of the projection optical system, based on a first coefficient defining a relationship between the amount of change in the environment condition and an amount of change in imaging characteristics of the projection optical system and a second coefficient defining a relationship between the amount of change in imaging characteristics of the projection optical system and the correction amount of the correction unit; and cause said correction unit to operate in accordance with the calculated correction amount, wherein values of the first coefficient and the second coefficient are determined by a value of at least one of the parameters, and wherein said controller is configured to:

calculate an amount of change in imaging characteristics of the projection optical system using the amount of change in the environment condition and the first coefficient; and calculate a correction amount of the correction unit using the calculated amount of change in imaging characteristics and the second coefficient.

7. A method of manufacturing a device, the method comprising:

exposing a substrate using an exposure apparatus;

developing the exposed substrate; and processing the developed substrate to manufacture the device, said exposure apparatus comprising:

an illumination optical system which illuminates a mask on which a pattern is formed;

a projection optical system which projects an image of a pattern of the illuminated mask onto a substrate;

an obtaining unit which obtains data of an amount of change in an environment condition in the projection optical system and data of at least one of parameters, including a numerical aperture and effective light source of the illumination optical system, a numerical aperture of the projection optical system, and a size and pitch of the pattern;

a correction unit which corrects a change in imaging characteristics of said projection optical system; and a controller which controls said correction unit, wherein said controller is configured to:

calculate a correction amount of said correction unit which corrects the change in imaging characteristics of said projection optical system, based on a first coefficient defining a relationship between the amount of change in the environment condition and an amount of change in imaging characteristics of the projection optical system and a second coefficient defining a relationship between the amount of change in imaging characteristics of the projection optical system and the correction amount of the correction unit; and cause said correction unit to operate in accordance with the calculated correction amount, wherein values of the first coefficient and the second coefficient are determined by a value of at least one of the parameters, and wherein said controller is configured to:

calculate an amount of change in imaging characteristics of the projection optical system using the amount of change in the environment condition and the first coefficient; and calculate a correction amount of the correction unit using the calculated amount of change in imaging characteristics and the second coefficient.

* * * * *